(12) United States Patent
Saito et al.

(10) Patent No.: US 6,402,530 B1
(45) Date of Patent: Jun. 11, 2002

(54) JUNCTION BOX

(75) Inventors: Yukitaka Saito; Tatsuya Sumida; Noriko Kobayashi, all of Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/924,529

(22) Filed: Aug. 9, 2001

(30) Foreign Application Priority Data

Aug. 9, 2000 (JP) ........................................ 2000-240655

(51) Int. Cl.[7] .............................................. H01R 12/00
(52) U.S. Cl. ........................ 439/76.2; 439/65; 439/74; 439/949
(58) Field of Search ........................... 439/76.1, 74, 65, 439/76.2, 949

(56) References Cited

U.S. PATENT DOCUMENTS

| | | | | | |
|---|---|---|---|---|---|
| 5,179,503 A | * | 1/1993 | Fouts et al. | ................. | 361/393 |
| 5,581,130 A | * | 12/1996 | Boucheron | ................. | 307/10.1 |
| 5,764,487 A | * | 6/1998 | Natsume | ..................... | 361/775 |
| 5,902,138 A | * | 5/1999 | Murakami | ................. | 439/76.2 |
| 6,116,916 A | * | 9/2000 | Kasai | ......................... | 439/76.2 |
| 6,238,221 B1 | * | 5/2001 | Ikeda et al. | ................. | 439/76.2 |
| 6,270,360 B1 | * | 8/2001 | Yanase | ..................... | 439/76.2 |

* cited by examiner

*Primary Examiner*—Tho D. Ta
*Assistant Examiner*—Truc Nguyen
(74) *Attorney, Agent, or Firm*—Oliff & Berridge, PLC

(57) ABSTRACT

An electrical junction box for a vehicle has a casing and in the casing a connector circuit having first bus bars fixed on a connector circuit substrate to connect to electrical connectors, a fuse circuit with second bus bars on a fuse circuit substrate, discrete from the connector circuit, to connect to fuses, and a relay circuit having third bus bars on a relay circuit substrate, discrete from the connector circuit, to connect to relays. The first bus bars have welding portions welded to and the bus bars of one of the fuse and relay circuits have welding portions opposed thereto. At the adjacent pairs of these welded connections an insulating partitioning member is interposed between the welded connections so as to prevent contact between them.

12 Claims, 10 Drawing Sheets

Prior Art

JUNCTION BOX

BACKGROUND OF THE INVENTION

1. Field of Invention

The present invention relates to an electrical junction box suitable to be connected for example to a wire harness in a vehicle such as an automobile and a method of assembling the junction box.

2. Description of Related Art

Recently, the increase of electrical and electronic component parts which are mounted in a vehicle has led to increase of circuits to be accommodated in electrical connection boxes and junction boxes in the vehicle. Thus, when forming branch circuits at a high density, it is necessary to mount a large number of component parts on a junction box or the like, which causes increase of manufacturing complexity.

In a junction box disclosed in Japanese Laid-Open Patent Publication No. 2000-92660 and shown in FIG. 12, bus bars 5A–5D are laminated one upon another between an upper case part 2 and a lower case part 3, with insulation plates 4A–4E interposed between the bus bars 5A–5D. The upper case part 2 has a connector receiving portion 2a, a relay receiving portion 2b, and a fuse receiving portion 2c, on which in use connectors 6, relays 7 and fuses 8 are mounted respectively. Terminals of the connectors 6, the relays 7 and the fuses 8 are connected to tabs 5a projecting from the bus bars directly or are connected to the bus bars through relaying terminals. The lower case part 3 has also a connector receiving portion 3a to connect connectors to tabs projecting from the bus bars.

In the junction box 1, with the increase of the number of circuits, the area and the number of layers of the bus bars increase and thus the size of the junction box becomes large. If the connector, relay and fuse receiving portions are arranged on both the upper and lower case parts to connect connectors, relays and fuses to internal circuits of the junction box, it is possible to make the area of the junction box smaller than in the case where the receiving portions are mounted on only the upper case part or the lower case part.

However, if the connector, relay and fuse receiving portions are mounted on both the upper and lower case parts such that they are opposed vertically, the bent tabs of bus bars must overlap each other and thus cannot be easily arranged. In this case, it is necessary to form tabs on bus bars of other layers, which causes an increase of number of layers of bus bars, and thus leads to the increase of the height of the junction box. That is, the junction box is necessarily large.

Further, the above-described junction box is so constructed that the bus bars are connected to the connectors, the fuses and the relays. Thus, when the specification of the connection between the internal circuit and the fuses and/or the relays is altered, it is necessary to alter the entire internal circuit. Consequently the above-described junction box is incapable of allowing a circuit alteration easily.

Some proposals have been made for replaceable modules in electrical circuits of automobiles.

U.S. Pat. No. 5,179,503 shows a modular automobile power distribution box having replaceable modules carrying relays or fuses. The relays or fuses in each module are directly connected to terminals of leads of wire harnesses. A pair of bus bars connect power terminals to the fuses of three maxi-fuse modules. There is no discussion of interconnection of the modules.

U.S. Pat. No. 5,581,130 discloses removable multi-function modules in individual casings which are mounted on a circuit board. Each module is electrically connected to the power supply distribution layer of the board by a pin. Alternatively, three modules are shown connected together by two electrical and mechanical coupling bars.

SUMMARY OF THE INVENTION

It is an object of the present invention to provide a junction box which can be made thin without increasing the number of layers of bus bars to be accommodated therein and which can cope with a circuit alteration easily.

According to the present invention, there is provided an electrical junction box that provides electrical connection to a plurality of electrical connectors, a plurality of fuses and a plurality of relays. The electrical junction box includes (i) a casing, (ii) a connector circuit in the casing having at least one connector circuit insulation substrate and plurality of first bus bars fixed on the insulation substrate, the first bus bars being arranged to provide electrical connection to electrical connectors in use, (iii) a fuse circuit in the casing having at least one fuse circuit insulation substrate, which is discrete from the connector circuit, and a plurality of second bus bars fixed on the fuse circuit insulation substrate, the second bus bars being arranged to provide electrical connection to fuses in use, and (iv) a relay circuit in the casing having at least one relay circuit insulation substrate which is discrete from the connector circuit, and a plurality of third bus bars fixed on the relay circuit insulation substrate, the third bus bars being arranged to provide electrical connection to relays in use.

The first bus bars have respective welding portions standing up from the connector circuit insulation substrate and arranged alongside one another. The bus bars of one of the fuse and relay circuits have respective welding portions standing up from the respective insulation substrate and arranged alongside one another opposed to the welding portions of said first bus bars. A plurality of welded connections are formed by welding together of the opposed welding portions.

At at least one adjacent pair of the welded connections, one of the respective circuits provides an insulating partitioning member which is interposed between said pair of welded connections so as to prevent contact between the pair of adjacent welded connections.

Preferably, the welded portions are formed by bending an end of each of the bus bars perpendicularly to a surface of the insulation plate, the portions being arranged in parallel or coplanar.

According to the invention, there is also provided a method of assembling the electrical junction box described above. The method includes the steps of:

(i) arranging a first welding portions respectively to opposite second welding portions in position to be welded thereto at a plurality of welding locations, with at least one insulating partitioning member provided by one of the respective circuits interposed between an adjacent pair of the welding locations so as to prevent contact during welding between the welding portions of a first one of the pair of welding locations with the welding portions of the other of the pair of welding locations, and (ii) after step (i), welding together the first and second welding portions at the respective welding locations.

The partitioning plate is erected on the insulation plate of the connector module or the fuse module and/or the relay module in such a way that the partitioning plate is inserted into a gap between the aligned welding portions of the connector module or the fuse module and/or the relay module.

The electrical junction box of the present invention has a modular construction. As described above, in the junction box of the present invention, the fuse circuit substrate and the relay circuit substrate are separately provided from the connector circuit substrate and are then joined by welding of the bus bars. This is in contrast with the conventional method, in which electrically conductive sheets are punched to form unitarily the connector connection circuit, the fuse connection circuit, and the relay connection circuit and form tabs to be connected to connectors, tabs to be connected to fuses, and tabs to be connected to relays and stacked in a single stack, the circuits thus being handled and arranged in a complicated manner. Consequently, the area of the bus bars increases and a large number of bus bars are necessary.

On the other hand, in the present invention, because the circuits are separately provided and welded, it is possible to avoid the complication of tabs overlapping each other and avoid a large number of bus bars. Thus, it is possible to form a thin or compact junction box. Further, because the circuits of the bus bars can be handled and arranged easily, the area of each bus bar can be reduced. Consequently, even though the bus bars are separately provided for the connector connections on the one hand and the fuse connections and the relay connections on the other hand, it is possible to reduce the total area of the bus bars and avoid increase of the area of the junction box.

Preferably, the connector module having the connector circuit, the fuse module having the fuse circuit, and the relay module having the relay circuit are all separately provided i.e. the respective insulation substrates are discrete from each other. Thus, if any one of the specification of the connector circuit, the fuse circuit, and the relay circuit is altered, the design of only any one of the modules need be changed. That is, the construction can cope with the alteration of the specification easily.

The first bus bars are provided separately from the second or/and third bus bars but connected thereto by means of welding. Thus this construction does not reduce reliability of the electrical connections. The welding portions may be connected to each other by ultrasonic welding, resistance welding, laser welding or gas welding.

When welding the welding portions to each other, a positioning portion of the partitioning plate is inserted into a gap between the arranged welding portions of the connector module or the fuse module and/or the relay module. Therefore, the welding portions are not dislocated and can be aligned and welded to each other, with the welding portions reliably held at a confronting position. Further, the partitioning plate partitions the welding portions from adjacent welding portions after they are welded to each other. Thus, there is no possibility that flexure of the welding portions causes adjacent welding portions to contact each other.

Preferably, the partitioning plate has an engaging portion which is positioned behind a rear surface of the welding portion of the connector module or the fuse module and/or the relay module and is capable of engaging the rear surface of the welding portion. Thereby, when welding the mating welding portions to each other, the engaging operation of the engaging portion prevents the mating portions from moving apart from each other. Accordingly, it is possible to maintain the position of the welding portions both longitudinally and widthwise.

Preferably, a supporting strip is provided on the insulation plate of the connector module or the fuse module and/or the relay module in opposition to both peripheral edges of the rear surface of the connector module or the fuse module and/or the relay module and the engaging portion of the partitioning plate is capable of engaging the rear surface of the welding portion of the connector module or the fuse module and/or the relay module through the supporting strip. This allows the superimposing position of the welding portions to be highly accurate.

Although the fuse circuit and the relay circuit may be separately formed, it is possible to integrate them with each other to form a fuse/relay composite circuit which receives fuses and relays on the same substrate which has bus bars for fuses and relays on it. In this case, if it is necessary to connect the circuit of any of the bus bars for fuses to any of the bus bars for relays, the respective bus bars are welded to each other or the bus bars may be integrally formed.

BRIEF DESCRIPTION OF THE DRAWINGS

Embodiments of the invention will now be described by way of non-limitative example with reference to the accompanying drawings. In the drawings.

DETAILED DESCRIPTION OF PREFERRED EMBODIMENTS

Exemplary embodiments of the present invention will be described below with reference to the drawings.

Figure 1:
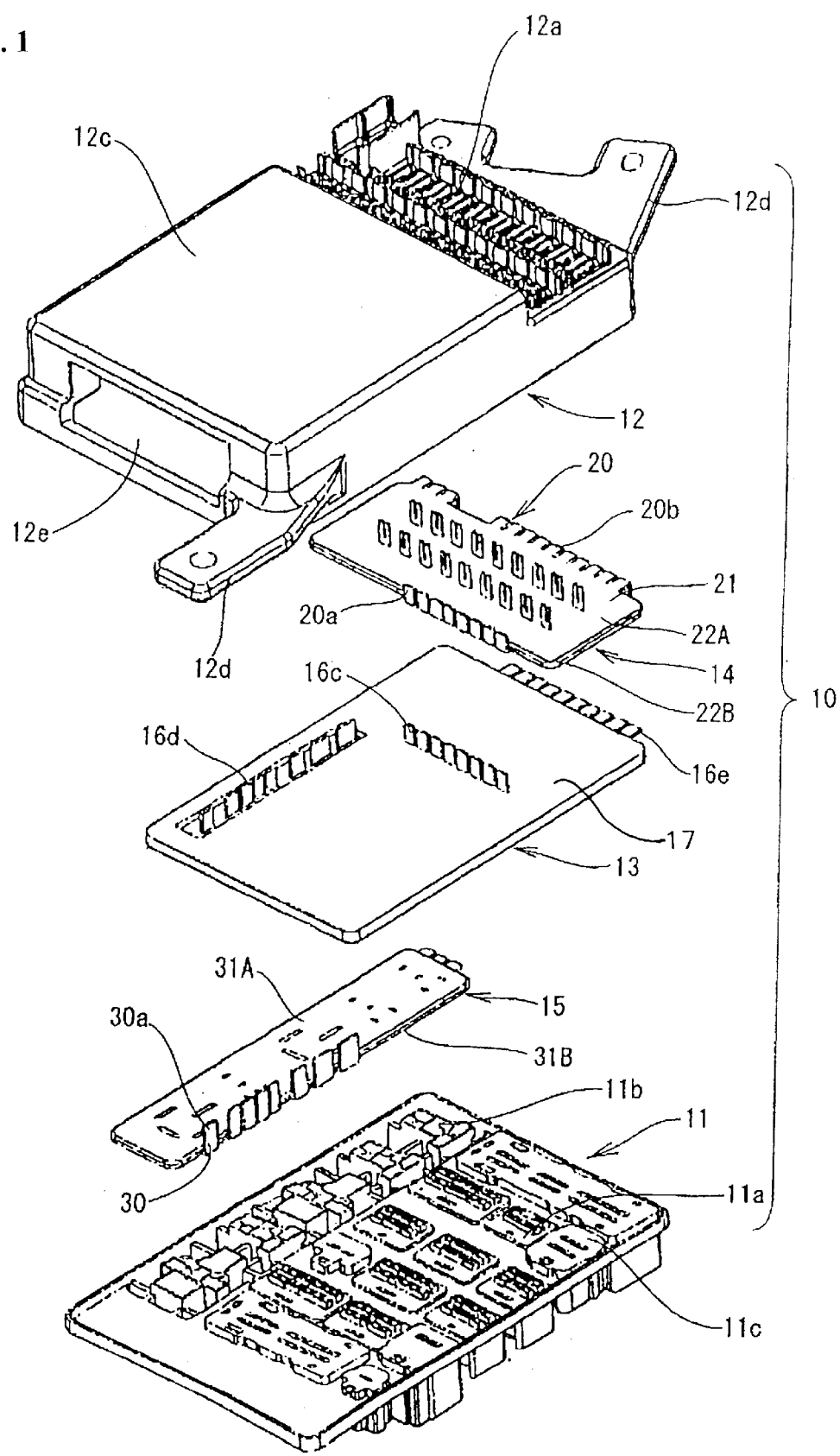
FIG. 1 is a schematic exploded perspective view showing a junction box of a first embodiment of the present invention.

FIG. 1 is a schematic exploded perspective view showing component parts constituting a junction box 10 which, in use, is mounted in a vehicle body and is connected to a wire harness of the vehicle body. The box 10 has a casing formed of molded synthetic resin including upper and lower casing parts herein called lower case part 11 and upper case part 12. In the casing, there are a connector module 13 constituting a connector circuit, a fuse module 14 constituting a fuse circuit and a relay module 15 constituting a relay circuit. Although not shown in FIG. 1, the casing formed by the lower case part 11 and the upper case part 12 accommodates an electronic control unit 40, seen in FIGS. 2 and 3.

The lower case part 11 has a plurality of connector receiving portions 11a in the form of sockets projecting outwardly and a plurality of relay receiving portions 11b also in the form of sockets arranged in a row along one longitudinal side. The upper case part 12 has a fuse receiving portion 1 2a having sockets to receive a plurality of fuses, formed at one widthwise side. The remaining part of the upper case part 12 is formed as a closed portion 12c which covers and contacts the upper surface of the electronic control unit 40 housed within the case. The upper case part 12 also has a connector receiving portion or socket 12e on the periphery face of its other widthwise side. The lower case part 11 and the upper case part 12 are locked to each other by fitting their peripheral walls on each other. Suitable conventional locking fittings (not shown) may be provided. The upper case part 12 also has fixing brackets 12d projecting from its opposite ends, for fixing it to for example a vehicle body.

Figure 4:
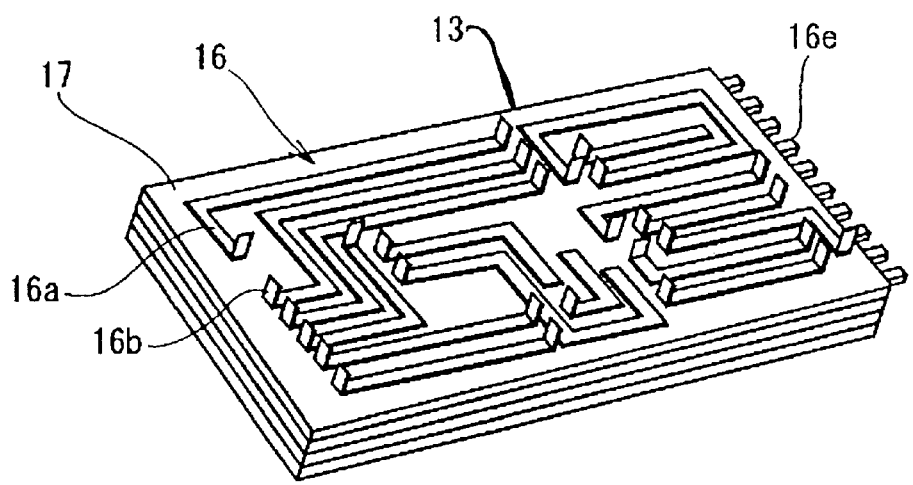
FIG. 4 is a schematic perspective view of a connector module of the box of FIG. 1 viewed from the underside thereof.

FIG. 4 is a schematic perspective view showing the bottom side of the connector module 13 of FIG. 1. The connector module 13 has a plurality of layers of connector connection bus bars 16 laminated one upon another with interposed insulation plates in a stack 17. In this embodiment, there are four layers of the connector connection bus bars. In FIG. 1, the connector module 13 is schematically shown, with one insulation plate of the stack 17 as the uppermost layer. By molding in resin, it is possible to form the insulation plate stack 17 and a multi-layer integral assembly of the bus bars 16.

Each layer of the bus bars 16 of the connector module 13 has circuit portions 16a having a required configuration obtained by punching a conductive plate. At least one tab 16b stands perpendicularly from each circuit portion 16a towards the lower case part 11 to project through a terminal hole 11c of one of the connector receiving portions 11a of the lower case part 11. A connector (not shown) secured on one end of a wire harness is in use fitted in the connector receiving portion 11a to connect a terminal in the connector to the tab 16b.

As shown in FIG. 1, the connector connection bus bars 16 have welding tabs 16c and 16d, projecting from holes of the insulation plate stack 17 at the upper side of the connector circuit 13 and welding tabs 16e projecting from the periphery of the insulation plate stack 17. The welding tabs 16c and 16e are welded to fuse connection bus bars 20 formed on the fuse module 14. The welding tabs 16d are welded to relay connection bus bars 30 formed on the relay module 15 which project upwardly through a slot in the connector module 13. The welding tabs 16c and the welding tabs 20a of the bus bars 20 are placed adjacent each other vertically. Similarly the welding tabs 16d and the welding tabs 30a of the bus bars 30 are placed adjacent each other extending vertically. The welding tabs 16e are welded to welding tabs 20b of the fuse connection bus bars 20 by laminating them on each other vertically and horizontally. There are thus a plurality of sets of each of the welding tabs 16c, 16d and 16e in each case parallel with one another.

Figure 5:
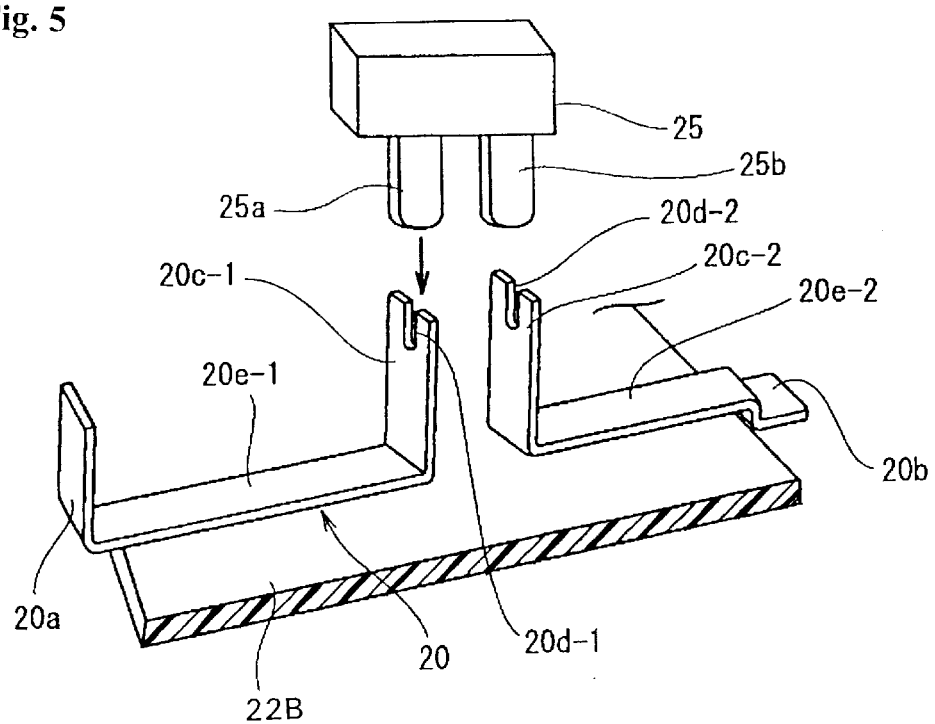
FIG. 5 is a schematic view showing fuse connection bus bars.

The fuse module 14, partly shown schematically in FIG. 5, has the fuse connection bus bars 20 arranged between two superimposed insulation plates 22A and 22B (see FIG. 1), formed by molding resin. The fuse connection bus bars 20 in use connect to terminals 25a or 25b of replaceable fuses 25. As shown in FIG. 5 (where the upper insulation plate is not shown), each fuse connection bus bar 20 has horizontal portions 20e-1 and 20e-2 fixed to the substrate 22B, terminal portions 20c-1 and 20c-2 formed by bending the fuse connection bus bar 20 upward at one end of the horizontal portion 20e-1 and 20e-2, and pressure connection grooves 20d-1 and 20d-2 formed at the upper end of the terminal portions 20c-1 and 20c-2 respectively to allow the terminals 25a and 25b of the fuse 25 to be fitted in the grooves 20d-1 and 20d-2 respectively. The end of one bus bar 20 (e.g., the left one in FIG. 5) opposite to its end to be connected to the terminal 25a projects to form the welding portion 20a. The end of the other bus bar 20 (e.g., the right one in FIG. 5) opposite to its end to be connected to the terminal 25b projects laterally to form the welding portion 20b. The welding portion 20a is projected horizontally from one edge of the substrate 21 in its longitudinal direction and bent vertically upward so that in the assembled position the welding portion 20a and the welding portion 16c of a connector bus bar 16 lie adjacent each other, as shown in FIG. 7. It is possible to fix the bus bar 20 to the insulation plate 22B by, for example, caulking. In this case, a caulking projection may be formed on the insulation plate and inserted through a hole formed on the bus bar 20. Then, the caulking projection may be deformed to fix the bus bar 20 at a predetermined position.

The relay module 15 has a construction similar to that of the fuse module 14. More specifically, the relay module 15 has a large number of relay connection bus bars 30 fixed between upper and lower insulation plates 31A and 31B (see FIG. 1). The bus bars 30 are separated from each other and individually connected to terminals of relays in use. As shown schematically in FIG. 6 (where the insulation plate 31B is not shown), each bus bar 30 of the relay module 15 has a horizontal portion 30b, a terminal portion 30c formed by bending the bus bar 30 upwards at one end of the horizontal portion 30b, and a pressure connection groove 30d formed at the outer end of the terminal portion 30c to allow a terminal 35a of a relay 35 to be fitted therein. The welding tab 30a is formed by bending the other end of the horizontal portion 30b in the shape of an "L" to permit the welding tab 30a and the welding tab 16d of one of the connector bus bars 16 to be aligned adjacent each other vertically in the assembled state.

Figure 8A:
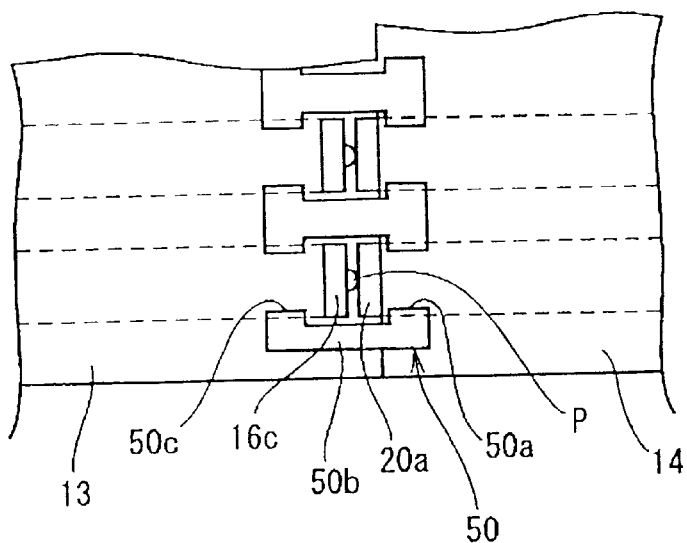
FIG. 8A is a plan view showing the superimposed welding portions of a connector module and a fuse module.
Figure 8B:
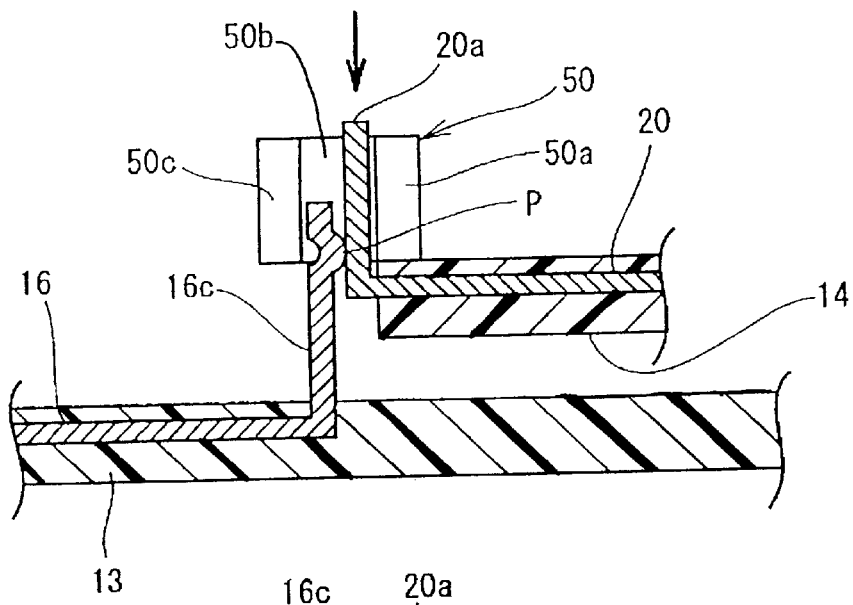
FIGS. 8B and 8C are sectional views each showing stages in a connection process.
Figure 8C:
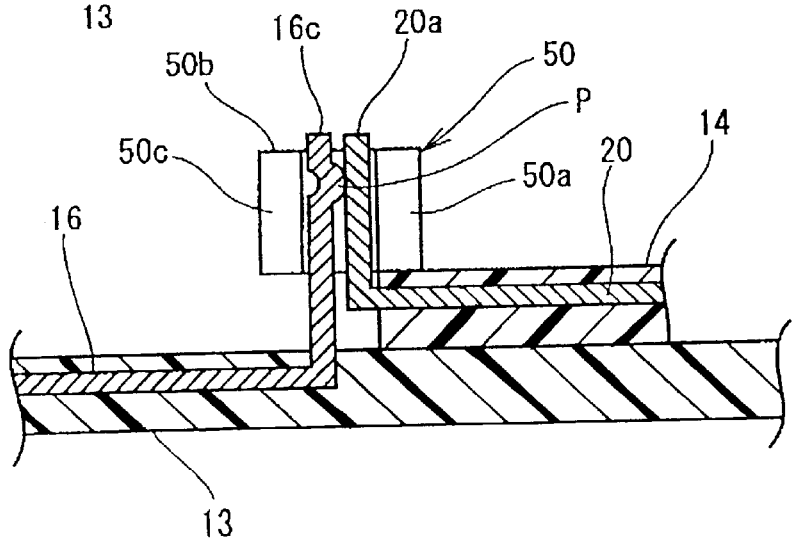
Figure 9:
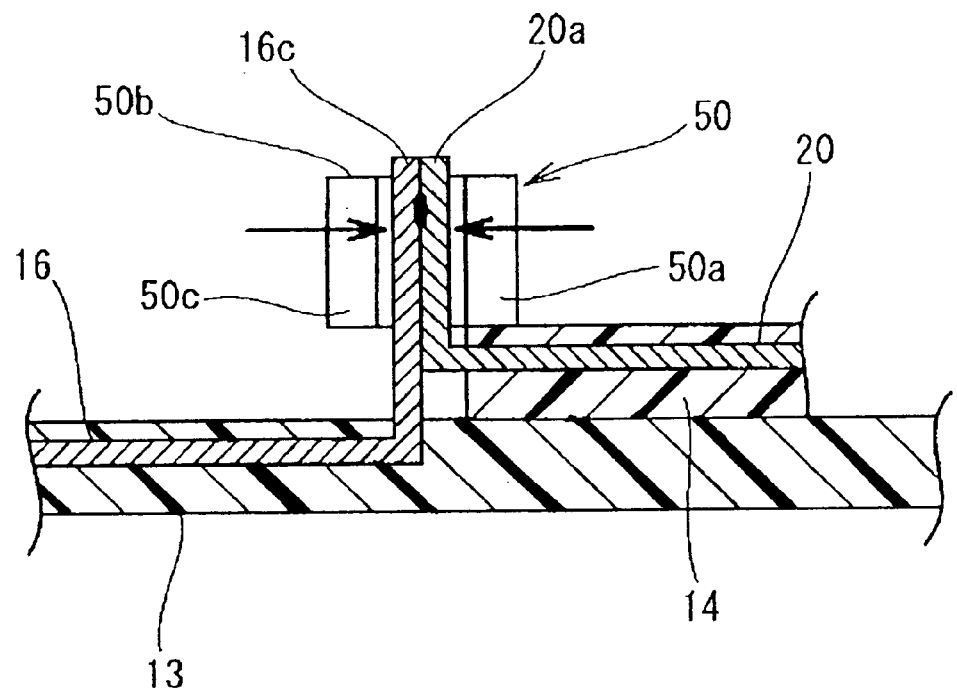
FIG. 9 is a sectional view showing a state in which the welding portions have been welded to each other.

FIGS. 7 to 9 show in detail the construction of the connector module 13 and the fuse module 14 in the region where the upstanding tabs or welding portions 20a of the fuse module 14 are brought together with and joined to tabs 16c of the connector module 13 by welding, with the fuse module 14 overlying the connector module 13. The details shown in these figures are omitted in FIGS. 1 to 6 for simplicity. On each module, the tabs 16c and 20a lie in a common vertical plane and are spaced laterally from each other.

Figure 7A:
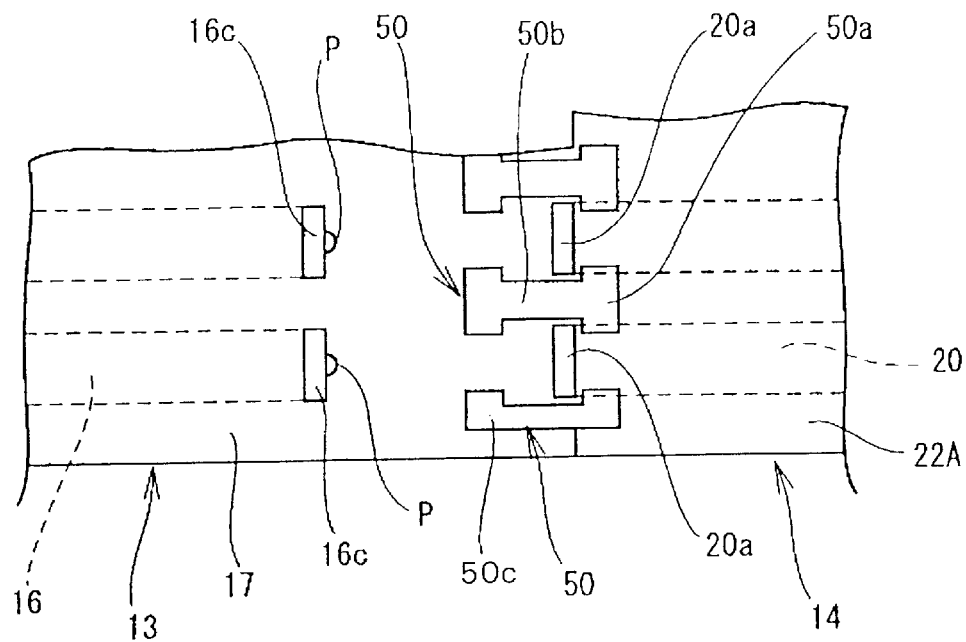
FIG. 7A is a plan view showing a partitioning plate aligning a connector module and a fuse module to be connected to each other.
Figure 7B:
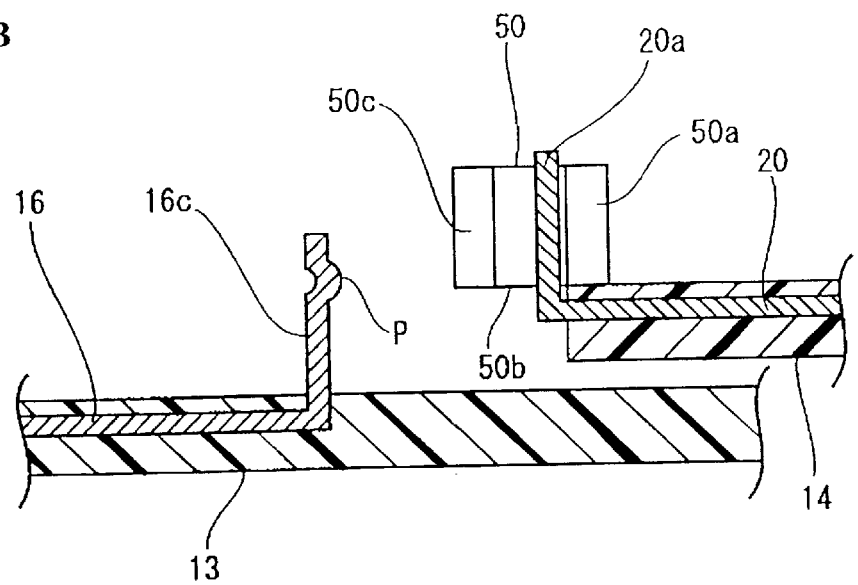
FIG. 7B is a sectional view of the construction shown in FIG. 7A.

As shown in FIG. 7A, at the end of the fuse module 14 where the welding portions 20a project, a plurality of partitioning plates 50 are integral with the covering insulation plate 22A and stand up on both sides of each of the welding portions 20a. Each partitioning plate 50 is a little lower in height than the adjacent welding portion or portions 20a. One end of each partitioning plate 50 extends behind a rear surface of each of the respective adjacent welding portions 20a and forms a holding portion 50a for preventing the welding portions 20a from deflecting backwards. The holding portion 50a engages the rear surface of the welding portions 20a by extending only minimally behind the surfaces so that the holding portion 50a does not interfere with the contact zone of a welding tool when the welding portion 20a is welded to the welding portion 16c.

Extending from the holding portion 50a of the partitioning plate 50 is a positioning portion 50b which is inserted into a gap between the respective pair of adjacent welding portions 16c on the connector module 13. The positioning portion 50b aligns the mating welding portions 16c and 20a confronting each other. The partitioning plate 50 includes an engaging portion 50c formed at the opposite end of the positioning portion 50b from the holding portion 50a. When the mating welding portions 16c and 20a are arranged adjacent each other, the engaging portion 50c extends behind and supports the rear surface of the welding portion 16c. The engaging portion 50c engages the rear surface of the welding portion 16c by extending only minimally behind the surface so that the engaging portion 50c does not interfere with the contact zone of the welding tool used when the welding portions 16c and 20a are welded to each other.

In the first embodiment, the partitioning plate 50 is mounted on the fuse module 14 and the welding portion 16c of the connector module 13 and the welding portion 20a of the fuse module 14 are welded to each other. The partitioning plate 50 may alternatively be mounted on the connector module 13. Similar partitioning plates 50 are provided on the relay module 15 where the welding portions 16d of the connector module 13 and the welding portions 30a of the relay module 15 are to be welded to each other.

In assembling the junction box 10 from the above-described component parts, initially, the fuse module 14 is disposed over one portion of the connector module 13. In this case, as shown in FIGS. 8A and 8B, the positioning portions 50b of the partitioning plate 50 on the fuse module 14 are inserted from above into the respective gaps between the adjacent welding portions 16c of the connector module 13. At the same time, the fuse module 14 is positioned (see FIG. 8C) in such a way that the engaging portions 50c engage an upper portion of the rear surface of each of the adjacent welding portions 16c. Thus, the partitioning plates 50 prevent the welding portions 16c and 20a from moving sideways away from each other. Further, owing to the engaging operation of the engaging portion 50c, welding portions 16c and 20a are prevented from moving apart backwards and separating from each other. That is, the welding portions 16c and 20a can be reliably aligned and maintained in position, in readiness for welding.

When the vertical welding portions 16c and 20a are aligned next to each other, the projection P formed on the welding portion 16c maintains a required spacing between the mating surfaces of welding portions 16c and 20a, in readiness for welding. When the welding portions 16c and 20a are welded to each other by compressing them with a resistance welding device (not shown), the projection P serving as the welding point is crushed. Consequently, as shown in FIG. 9, the welding portions 16c and 20a move to a connection position at which the mating surfaces thereof contact each other. In the welding operation, the partitioning plate 50 prevents the welding portions 16c and 20a from moving sideways relative to each other. Thus, the welding portions 16c and 20a are prevented from being dislocated.

The welding tabs are welded to each other by a suitable welding method such as ultrasonic welding, resistance welding, laser welding or gas welding. It is preferable to form a projection P on one or both confronting surfaces of each of the welding portions 16c, 20a, 16e, 20b, 30a, and 16d to increase the welding effect at the projection P.

Further after the pair of welding portions 16c and 20a are welded to each other, they are prevented from shifting and thus prevented from contacting the adjacent pair of welding portions 16c and 20a. In this manner, the connector module 13 and the fuse module 14 are reliably connected to each other. Although detailed description is omitted herein, the connection between the connector module 13 and the relay module 15, when the relay module 15 is superimposed on the lower surface of the connector module 13 to connect the connector module 13 and the relay module 15 to each other, can be formed in a similar manner.

As described above, the fuse module 14 is mounted over the connector module 13 at one widthwise side thereof, and the relay module 15 is disposed under the connector module 13 at one longitudinal side thereof to integrate the three modules. Then, this subassembly of the three modules 13, 14 and 15 is accommodated in the lower case part 11. In this case, the terminal portions of the connector module 13 are disposed in the connector receiving sockets 11a, and the terminal portions 30c of the relay module 15 are disposed in the relay receiving sockets 11b.

Figure 2:
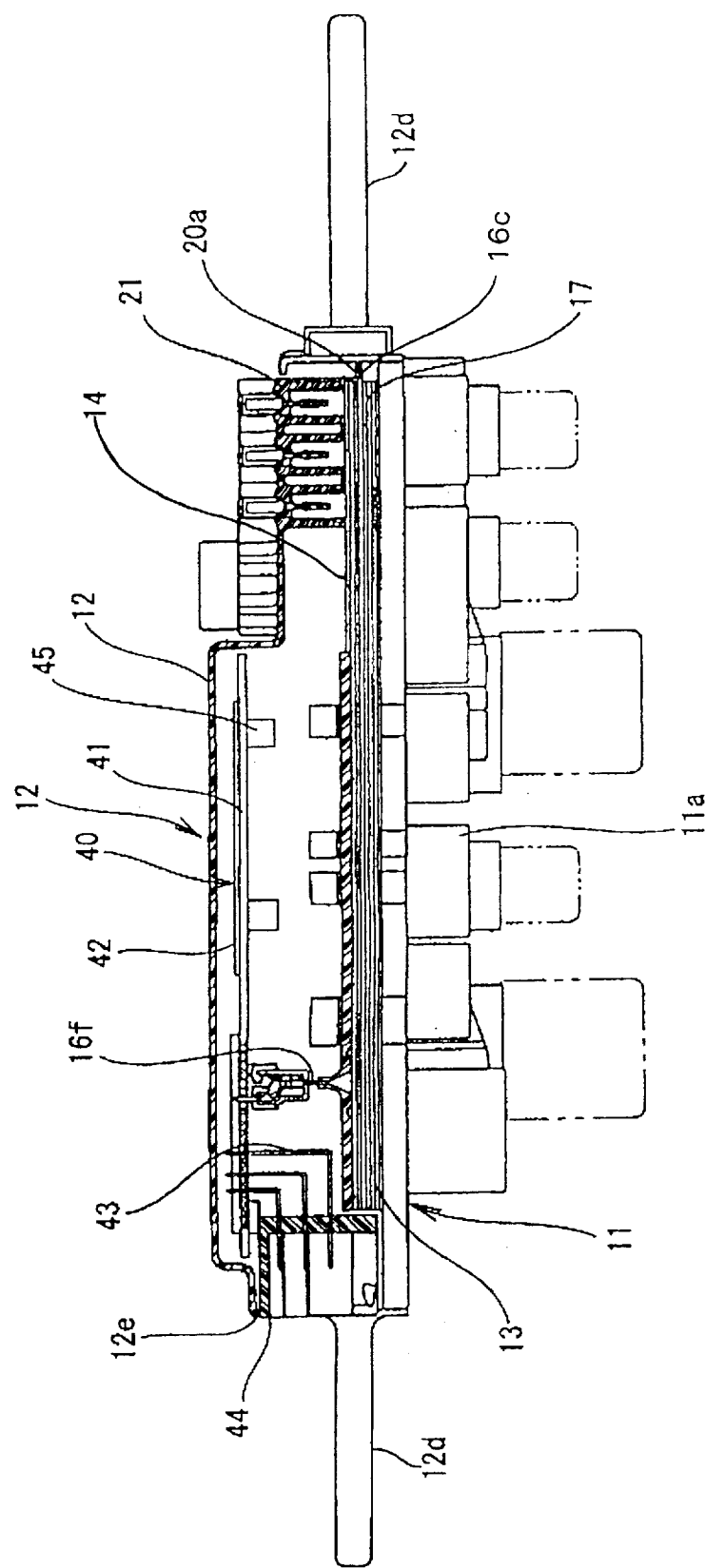
FIG. 2 is a sectional view showing a state in which the junction box of FIG. 1 has been assembled.
Figure 3:
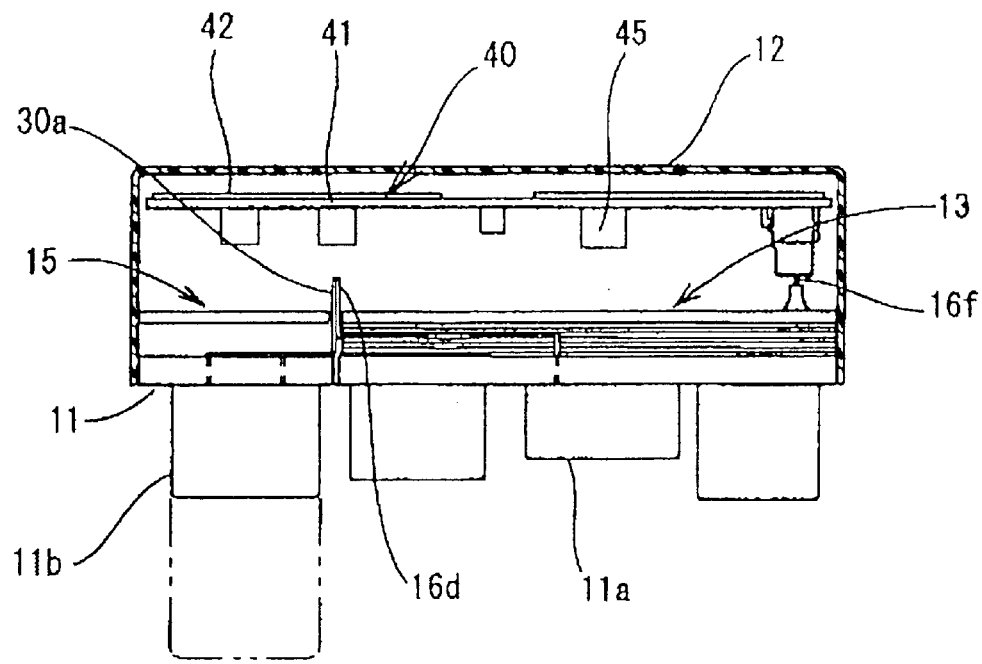
FIG. 3 is a sectional view showing the junction box of FIG. 2, taken along a line perpendicular to FIG. 2.

Then, the electronic control unit 40 is mounted on the connector module 13 at a portion thereof on which the fuse module 14 is not mounted (see FIGS. 2–3). The electronic control unit 40 has, at one side thereof, a connector portion 44 having bent and projecting conductive pins 43 connected with electrical conductors 42 fixed to a substrate 41 thereof. The electrical conductors 42 are connected to tabs 16f projecting from the bus bars 16 of the connector module 13. The conductors 42 are connected to a large number of electronic component parts 45 mounted on the substrate 41. The electronic component parts 45 is fixed to the substrate 41, with the electronic component parts 45 projecting downward. The welding tabs of the bus bars 16, 20 and 30 are disposed in a dead space below the electronic control unit 40.

After the electronic control unit 40 is mounted on the connector module 13, the upper case part 12 is mounted on the lower case part 11. At this time, the terminal portions 20c of the bus bars 20 fixed to the fuse module 14 become located in the fuse receiving portions 12a.

At this time, the connector portion 44 of the electronic control unit 40 is fitted in a notch 12e of the upper case 12. The assembling of the junction box 10 is completed by locking the upper case 12 and the lower case 11 to each other.

Figure 6:
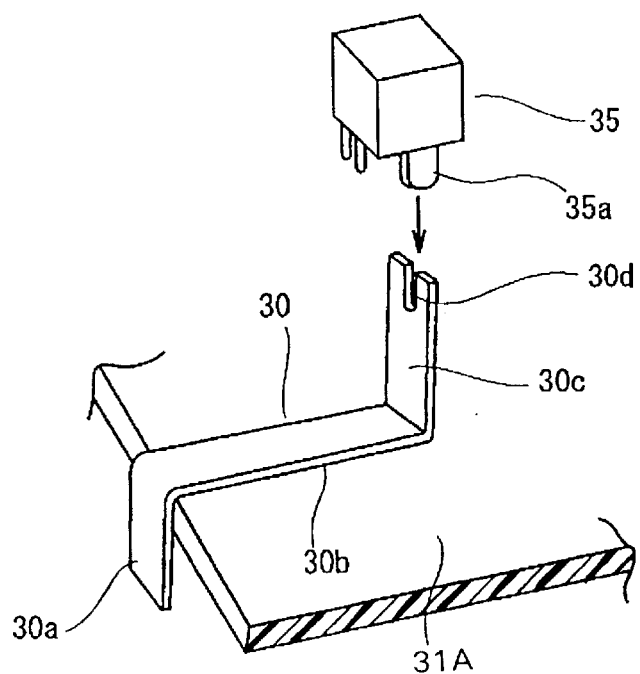
FIG. 6 is a schematic view showing a relay connection bus bar.

As shown in FIGS. 5 and 6, when the fuses 25 and the relays 35 are inserted into the fuse accommodation portion 11a and the relay accommodation portion 11b, respectively, they are fitted in and connected to the pressure connection grooves 20d of the fuse connection bus bars 20 and the pressure connection grooves 30d of the relay connection bus bars 30, respectively.

Figure 10A:
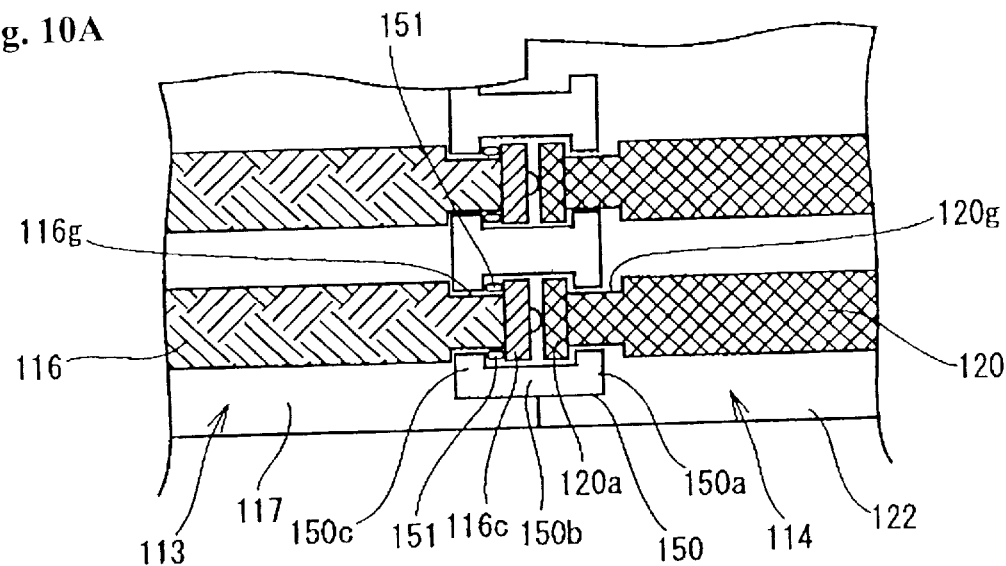
FIG. 10A is a plan view of a modified embodiment in which a connector module and a part module have been abutted to each other.
Figure 10B:
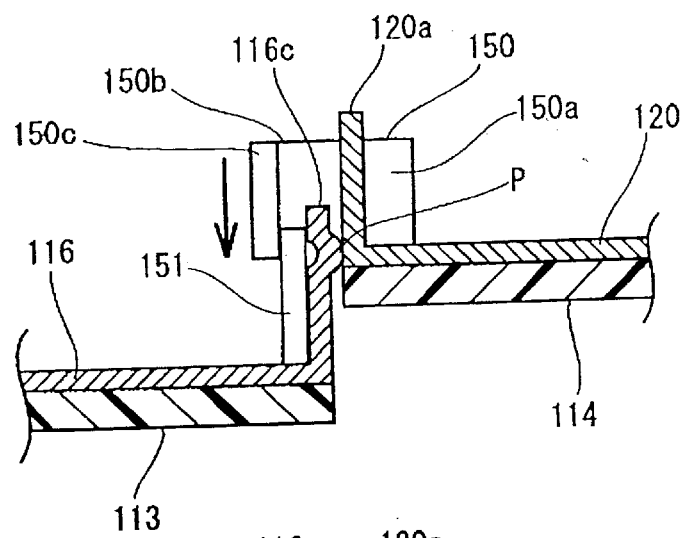
FIGS. 10B and 10C are sectional side views each showing stages in a connection process of the embodiment of FIG. 10A.
Figure 10C:
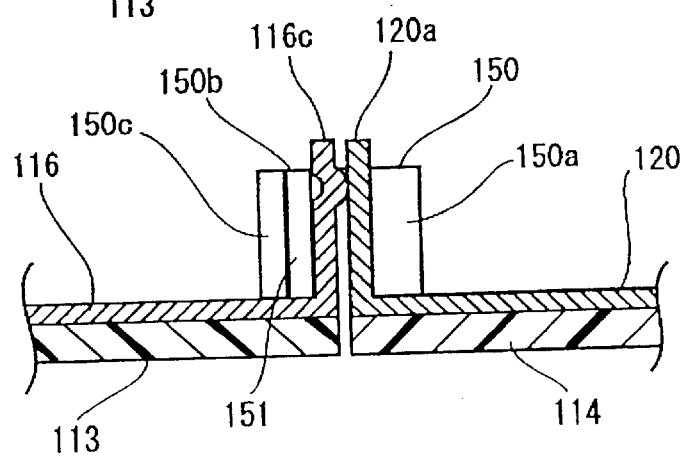

FIGS. 10A and 10B show a second embodiment. The connector module 113 is connected to a part module 114 such as the fuse module or the relay module not by superimposing them on each other but by butting them to each other at their edges as shown in FIG. 10C. Bus bars 116 and 120 are fixed to the surface of the insulation plates 117 and 122 respectively. In correspondence to the positions of holding portions 150a of partitioning plates 150, notches 120g are formed on the base portions of the bus bars 120 of the part module 114 to accommodate the holding portions 150a. Each notch 120g extends rearwardly from the rear surface of the upright welding portion 120a of the bus bar. Similar notches 116g are formed on the base portions of the bus bars 116 of the connector module 113 to accommodate the engaging portions 150c of the partitioning plates 150. In the region of each notch 116g, supporting strips 151 are formed integrally with the insulation plate 117 and stand up adjacent to both peripheral edges of the rear surface of the respective welding portion 116c. The supporting strips 151support both sides of the base portion of the bus bar 116 provided on the connector module 113, thus preventing the welding portion 116c from moving sideways or backwards away from the welding portion 120a. In the second embodiment, the engaging portion 150c of the partitioning plate 150 supports the rear surface of the welding portion 116c through the supporting strip 151.

The part module 114 is mounted on the connector module 113 by inserting partitioning plates 150 of the part module 114 between the adjacent welding portions 116c of the connector module 113 from above the welding portions 116c as shown in FIG. 10B. Then, the mating welding portions 116c and 120a may be welded to each other.

In the first and second embodiments, welding may be achieved by ultrasonic welding, laser welding or gas welding, instead of resistance welding.

Figure 11A:
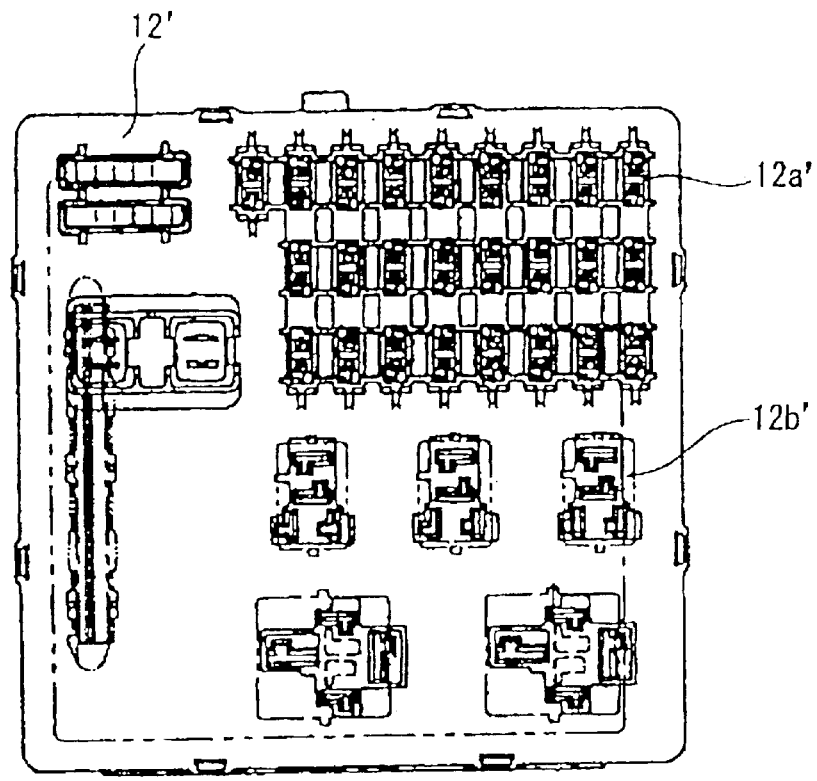
FIG. 11A is a plan view showing a junction box of another embodiment of present invention.
Figure 11B:
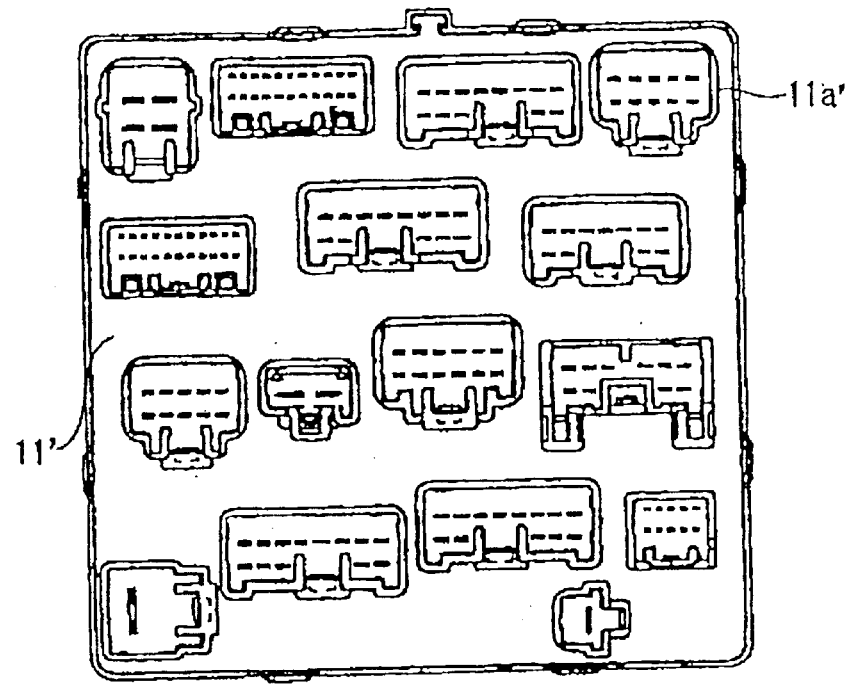
FIG. 11B is a bottom view showing the junction box of another embodiment of the present invention.
Figure 12:
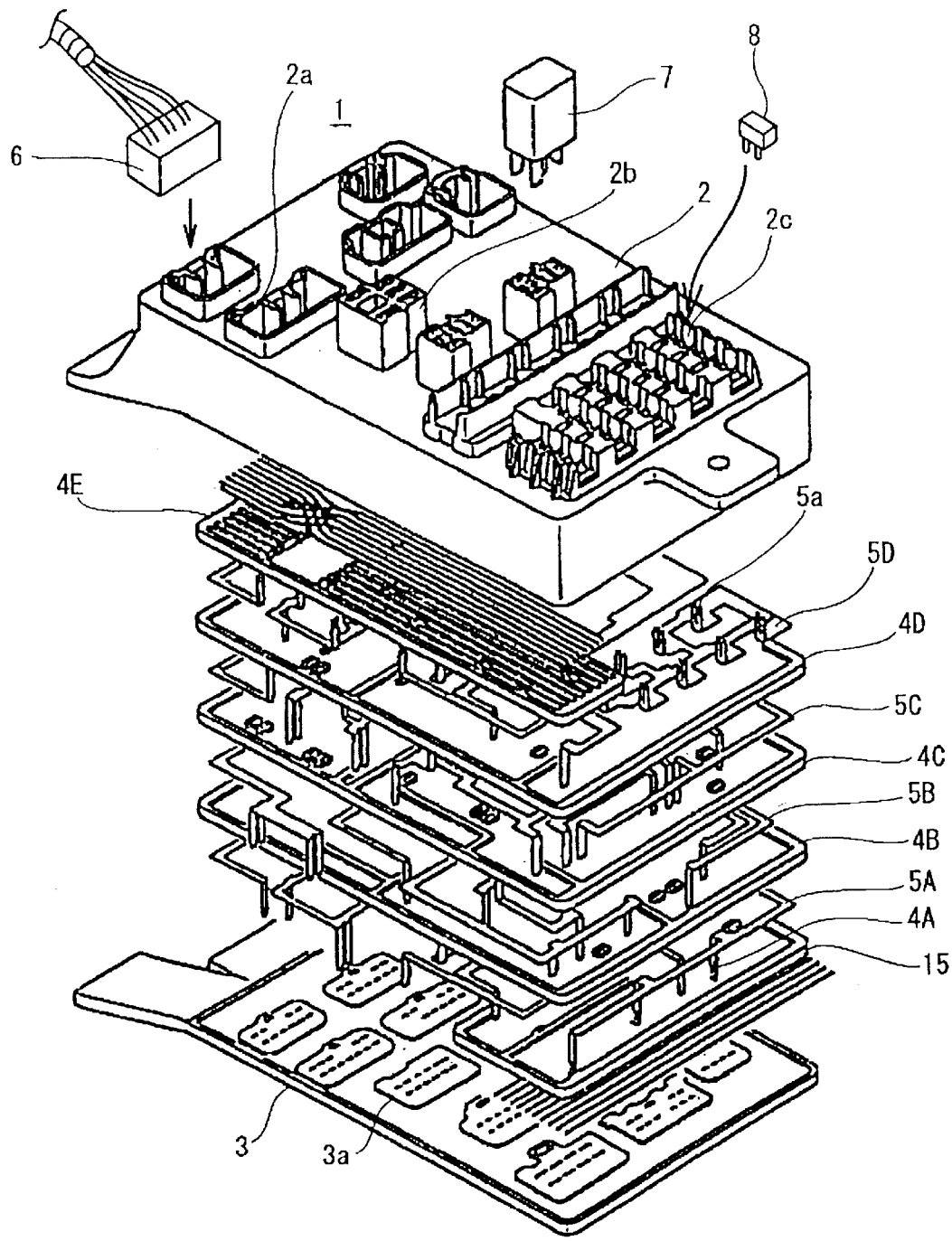
FIG. 12 is an exploded perspective view showing a conventional junction box.

In the embodiments described above, the fuse module and the relay module are separate from each other. Instead, the fuse module and the relay module may be integral with each other to form a composite module. In this case, as shown in FIGS. 11A and 11B, a fuse receiving portion 12a' and a relay receiving portion 12b', in which terminal portions of bus bars of the composite module are disposed, are formed in the upper case 12'. Formed in the lower case 11' is a connector receiving portion 11a' in which terminal portions of bus bars of the connector module are disposed. In the second embodiment, the positioning plate is formed on the part module 114. However, it could be formed on the connector module 113.

The junction box of the present invention is not limited to the above-described embodiments. For example, each of the fuse module and the relay module may be divided into two parts, respectively. In this case, when the specification of any one of the fuses or the relays is altered, it is possible to replace only the module associated with the fuse or the relay which should be altered. However, if the fuse module and the relay module are divided into three or more parts, many assembling stages are required. Thus, it is preferably to divide the fuse module and the relay module into at most two parts, respectively, in the case of a large junction box.

The connector connection bus bars of the connector module, the fuse connection bus bars of the fuse module, and the relay connection bus bars of the relay module may be welded to each other in any of the following three patterns, selected according to the circuit design:

(1) A connector connection bus bar and a fuse connection bus bar are welded to each other.

(2) A connector connection bus bar and a relay connection bus bar are welded to each other.

(3) A connector connection bus bar is welded to a fuse connection bus bar and to a relay connection bus bar.

In case (3), the fuse connection bus bar may be welded to a welding portion of the connector connection bus bar at one end thereof; the relay connection bus bar may be welded to the welding portion of the connector connection bus bar at the other end thereof; and a tab provided at a third portion of the connector connection bus bar may be connected to a connector.

In addition to the connector module, fuse module, relay module and the electronic control unit, the lower and upper case parts may accommodate a circuit consisting of electrical wires connected to pressure contact terminals on the base circuit. The wires may also connect to connectors which fit in the connector receiving portion. It is also possible to add a circuit formed as an electrically conductive portion of an FPC (flexible printed circuit), a PCB (printed circuit board) or a highly electrically conductive resin molded with insulating resin.

As is apparent from the foregoing description, in the junction box of the present invention, the connector connection bus bars are separately provided from the fuse connection bus bars and the relay connection bus bars, using discrete substrates. Thus, tabs for connecting the connector connection bus bars, the fuse connection bus bars, and the relay connection bus bars to connectors, fuses and relays, respectively are disposed at different positions and do not overlap each other. Accordingly, it is unnecessary to increase the number of layers of the bus bars to provide them with tabs. Consequently, it is possible to form a thin junction box or otherwise to achieve a compact and logical layout. For example, in the case of the construction of the first embodiment, the number of bus bars can be reduced from six layers required in the conventional junction box to four layers. Thus, it is possible to reduce the thickness of the junction box.

Further, the partitioning plate formed on one of the mating modules partitions a plurality of the mating welding portions from each other, thus preventing the welding portions from moving sideways out of alignment. Thus, the welding portions can be reliably aligned and maintained in position. Further, the engaging portion formed on the partitioning plate is capable of engaging the rear surface of the welding portion of the mating module, thus preventing the welding portions from moving backwards apart from each other. Accordingly, the welding portions can be reliably prevented from being dislocated during welding.

Further, as described above, because the fuse connection tabs and the relay connection tabs are separate from the bus bars of the base circuit, it is easy to handle and arrange the bus bars of the base circuit. Thus, it is possible to reduce the area of the bus bars and hence the area of the junction box. Consequently, in the case where the bus bars are divided and the ends of the bus bars are welded to each other, the area of the entire bus bars is not large and hence the area of the junction box is not increase.

Further, if the specification of the fuses and the relays is altered, the fuse module, the relay module or the composite module of the fuse module and the relay module is replaced. Thus, it is unnecessary to alter the entire upper and lower cases including the base circuit. That is, the construction can permit the alteration of the specification quickly and at low cost.

While the invention has been illustrated by the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without parting from the spirit and scope of the invention.

What is claimed is:

1. An electrical junction box that provides electrical connection to a plurality of electrical connectors, a plurality of fuses and a plurality of relays, comprising;

(i) a casing;

(ii) a connector circuit in said casing having at least one connector circuit insulation substrate and a plurality of first bus bars fixed on said insulation substrate, said first bus bars being arranged to provide electrical connection to electrical connectors in use;

(iii) a fuse circuit in said casing having at least one fuse circuit insulation substrate, which is discrete from said connector circuit, and a plurality of second bus bars fixed on said fuse circuit insulation substrate, said second bus bars being arranged to provide electrical connection to fuses in use; and (iv) a relay circuit in said casing having at least one relay circuit insulation substrate which is discrete from said connector circuit, and a plurality of third bus bars fixed on said relay circuit insulation substrate, said third bus bars being arranged to provide electrical connection to relays in use;

wherein said first bus bars have respective welding portions standing up from said connector circuit insulation substrate and arranged alongside one another, and said bus bars of one of said fuse and relay circuits have respective welding portions standing up from the respective insulation substrate and arranged alongside one another opposed to said welding portions of said first bus bars, the opposed welding portions being welded together to form a plurality of welded connections, and wherein at at least one adjacent pair of said welded connections one of the respective circuits provides an insulating partitioning member which is interposed between said pair of welded connections and prevents contact between said pair of adjacent welded connections.

2. An electrical junction box according to claim 1, wherein said partitioning member is molded in one-piece with the respective insulation substrate.

3. An electrical junction box according to claim 1, wherein said fuse circuit insulation substrate and said relay circuit insulation substrate are discrete from each other, whereby said fuse circuit and said relay circuit constitute separate modules in said junction box.

4. An electrical junction box according to claim 1, wherein said fuse circuit insulation substrate and said relay circuit insulation substrate are combined as a unitary common substrate carrying said second bus bars and said third bus bars, whereby said fuse circuit and said relay circuit constitute a combined module in said junction box.

5. An electrical junction box according to claim 1, wherein said casing comprises upper and lower case parts, which are respectively molded synthetic resin members, at least one of said upper and lower case parts comprising connector sockets for receiving electrical connectors in use.

6. A vehicle having at least one electrical junction box according to claim 1.

7. An electrical junction box according to claim 1, wherein said partitioning member has at least one support portion located rearwardly of a rear face of one of said welding portions to provide support of the welding portion against rearward bending.

8. An electrical junction box according to claim 7, wwherein said partitioning member has a spaced pair of said support portions which are located respectively rearwardly of the rear faces of both welded-together welding portions of one said welded connection.

9. An electrical junction box according to claim 7, wherein at said welded connections, the other of the respective circuits has at least one upstanding support member interposed between said support portion of said partitioning member and said rear face of said welding portion supported thereby.

10. A method of assembling an electrical junction box that provides electrical connection to a plurality of electrical connectors, a plurality of fuses and a plurality of relays, said electrical junction box comprising:

(a) a connector circuit having at least one connector circuit insulation substrate and a plurality of first bus bars fixed on said insulation substrate said first bus bars being arranged to provide electrical connection to electrical connectors in use;

(b) a fuse circuit having at least one fuse circuit insulation substrate, which is discrete from said connector circuit, and a plurality of second bus bars fixed on said fuse circuit insulation substrate, said second bus bars being arranged to provide electrical connection to fuses in use; and (c) a relay circuit having at least one relay circuit insulation substrate which is discrete from said connector circuit, and a plurality of third bus bars fixed on said relay circuit insulation substrate, said third bus bars being arranged to provide electrical connection to relays in use;

wherein said first bus bars have first welding portions standing up from said connector circuit insulation substrate and arranged alongside one another, and said bus bars of one of said fuse and relay circuits have second welding portions stand up from the respective insulation substrate, said method including the steps of:

(i) arranging said first welding portions respectively opposite said second welding portions in position to be welded thereto at a plurality of welding locations, with at least one insulating partitioning member provided by one of the respective circuits interposed between an adjacent pair of said welding locations so as to prevent contact, during welding, between said welding portions of one of said pair of welding locations with said welding portions of the other of said pair of welding locations, and (ii) after step (i), welding together said first and second welding portions at the respective welding locations.

11. A method according to claim 10, further comprising a step of locating at least one support portion of said partitioning member rearwardly of a rear face of one of said welding portions at at least one of the pair of welding locations to provide support of the welding portion against rearward bending.

12. A method according to claim 10, wherein the welding portions at each said welding location are joined by one of ultrasonic welding, resistance welding, laser welding and gas welding.

* * * * *